United States Patent [19]

Spiegel

[11] 4,237,425

[45] Dec. 2, 1980

[54] AUTOMATIC BIAS ADJUSTING CIRCUIT

[76] Inventor: David A. Spiegel, 3625 W. Moreland Rd., Apt. C-23, Willow Grove, Pa. 19090

[21] Appl. No.: 35,489

[22] Filed: May 3, 1979

[51] Int. Cl.$^3$ ............................................. H03F 3/18
[52] U.S. Cl. .................................. 330/263; 330/270; 330/273
[58] Field of Search ................ 330/273, 274, 270, 263

[56] References Cited

U.S. PATENT DOCUMENTS 3,223,933  12/1965  LaFond et al. ...................... 330/270
3,531,728  9/1970   Visher ................................. 330/274

FOREIGN PATENT DOCUMENTS

2238284  7/1973  France.

Primary Examiner—Harold A. Dixon
Attorney, Agent, or Firm—Paul & Paul

[57] ABSTRACT

A bias adjusting circuit for a push-pull amplifier is disclosed, which automatically increases or decreases the bias in the amplifier circuit so that the desired bias level is maintained. The bias adjusting circuit measures the current consumption of both halves of the push-pull amplifier, determines the point at which output current zero crossings have occurred, and at these times makes any necessary changes to the bias current to conform to a desired level. The circuit has an insignificant effect on the amplifier's power efficiency, and offers a degree of bias stability unattainable with conventional techniques.

23 Claims, 7 Drawing Figures

AUTOMATIC BIAS ADJUSTING CIRCUIT

BACKGROUND OF THE INVENTION

This invention relates to the operation of push-pull amplifiers. In particular, the invention discloses a circuit which provides automatic bias adjustment for such amplifiers.

Push-pull amplifiers have been well known in the art for some time. Examples of such amplifiers in the patent literature include U.S. Pat. No. 3,531,728 to W. A. Visher; U.S. Pat. No. 3,376,515 to W. G. Dilley; and U.S. Pat. No. 4,077,013 to G. S. Morez et al.

One problem common to all push-pull class AB amplifiers is that of correctly biasing the output stage for both minimum crossover notch distortion and low power dissipation. Conventional biasing circuits, even after manual trimming to compensate for component variations, do not always provide the desired bias level because of their sensitivity to changes in temperature. Thermal feedback techniques can greatly decrease this sensitivity but cannot effectively eliminate the problem in production because of the difficulty in achieving accurate tracking between output devices and thermal sensors. Other techniques to improve bias stability have adverse effects such as reduced open loop gain and increased power loss.

In any push-pull amplifier, there are two halves that make up the output stage. One provides positive current to the load; the other, negative. In addition, there is a current known as bias (also known as idling or quiescent current) which does not flow into the load but, instead, runs through both sides of the output stage to smooth the transition between positive and negative current excursions. There is an ideal level for this bias which will produce the best compromise between distortion and power efficiency in an amplifier.

In order to regulate the bias current, it is first necessary to measure it. While this task is easy to accomplish under amplifier idling conditions, it is difficult while the amplifier is active because the signal current, which is unpredictable and large in magnitude, follows nearly the same circuit path as the bias, obscuring any direct measurement. Fortunately, there is one feature of the push-pull amplifier configuration that permits measurement of bias current at certain times. Since signal current cannot flow through both halves of the output stage at once, then if both sides are simultaneously drawing more current than the desired bias level, it follows that the bias level must be too high. Similarly, if both sides of the push-pull amplifier are simultaneously drawing less current than the desired bias level, then the bias is too low. One of these two conditions will occur each time there is an output current zero crossing and the bias current is not equal to the desired level. By testing for these two conditions, a signal can be generated to correct for bias level deviations from the ideal. The latter signal can be fed back by appropriate circuitry to regulate the bias as necessary. The automatic bias adjusting circuit disclosed herein samples the bias level at output current zero crossing, and actively adjusts the bias current level to conform to the preselected value.

SUMMARY OF THE INVENTION

The invention described in this disclosure is made up of four parts. The first element is a measuring means to determine whether the current being consumed by each half of the push-pull amplifier's output stage is above or below a predetermined level (Ib). This would correspond to the relay in FIG. 1, the differential amplifiers in FIGS. 2, 3, 4, 6, & 7 and the Hall sensors in FIG. 5.

The second element of the invention is a logic means for extracting meaningful information about the level of bias from the current sensing means. Near output current zero crossings, both current sensors will indicate current levels above or below "Ib", depending on whether the bias current is too high or too low. During this interval, appropriate output signals must be generated to properly drive the following integrating element. In FIGS. 1, 2, 3, 4, 6, & 7, matched current sources I3 and I4 coupled with the logic function performed by the collector hookups of opposing transistors perform this logic function by summing analog signals. In FIG. 5, this same logic function is achieved by a digital means.

The third element is the integrating means. This could be in the form of a simple capacitor, an active integrator, a digital integrator (as in FIG. 5), or any other method that performs the integrating function. Although the digital integrator was used with digital logic circuits in FIG. 5, it should be noted that it could also be used with the analog logic means with slight modification. By the same token, analog logic means with slight modification. By the same token, analog integrators may be used with digital logic. This element of the system is used as a memory to store bias information during periods when bias levels cannot be measured and to vary the rate at which bias levels are altered during output current zero crossings.

Figure 6:
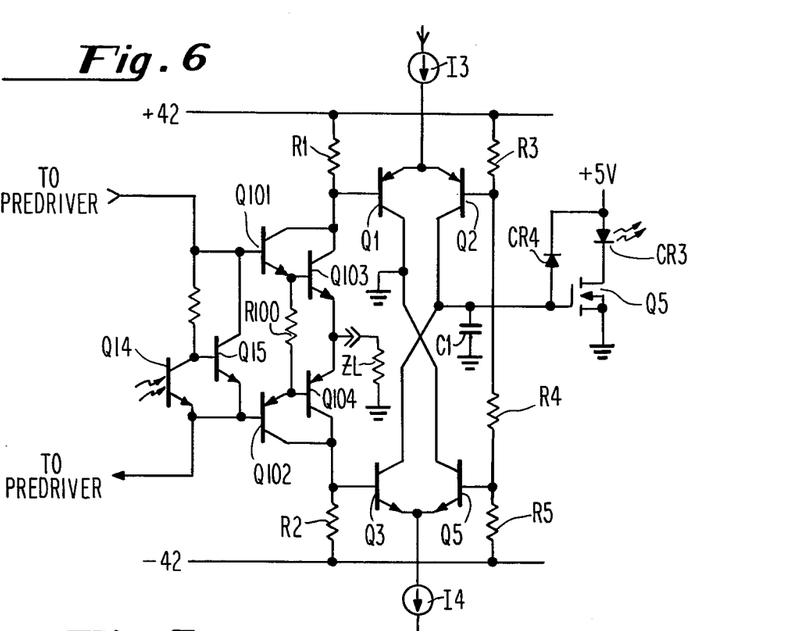
FIG. 6 is a schematic diagram of an embodiment of the present invention which explicitly shows a feedback means which could be used.
Figure 7:
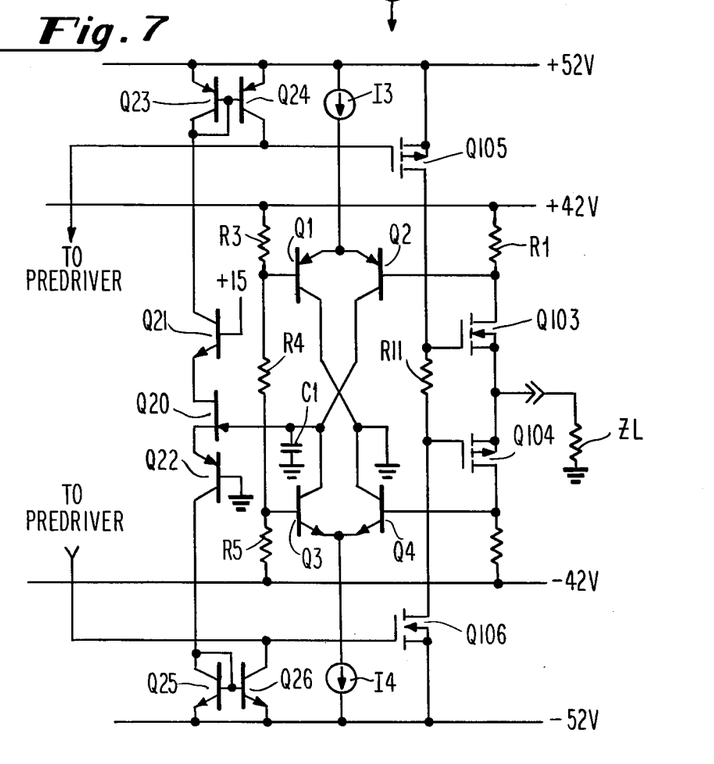
FIG. 7 is a schematic diagram of the present invention showing still another type of feedback means that could be applied.

The fourth and final element of this invention is the bias control means that actually changes bias levels as a function of an applied signal from the integrating means. This completes the bias control loop. In FIG. 6, this would be represented by the light emitting diode circuit and the shunt voltage regulator made up of Q14 and Q15. In FIG. 7, the bias control means are comprised of transistors Q20–Q26 and associated circuitry.

Accordingly, it is a primary object of the present invention to provide an automatic bias adjusting circuit which substantially maintains the desired bias level in a push-pull amplifier circuit.

It is a further object of the present invention to provide a circuit as described, wherein the power loss due to the sampling of current is minimized.

It is a further object of the present invention to provide methods for reducing drift to enable this invention to be used with amplifiers whose bandwidth approaches DC.

It is a further object of the present invention to provide several methods of current sensing including transistorized measuring of voltages across current sensing resistors and Hall effect sensors.

It is a further object of the present invention to provide several methods of producing the desired logical functions that are required including a simple method of combining or diverting opposing current sources and a digital method involving the use of logical gates.

It is a further object of the present invention to provide several methods of integrating a control signal, including a simple capacitor integrator, an active integrator, and a digital integrator formed by an up-down counter and a digital to analog converter.

It is a further object of the present invention to provide methods for controlling bias levels including a method of using a phototransistor circuit as a shunt bias regulator and driving this photo device with a light-emitting diode, and a method which converts the control signal to a current and amplifies this current to control the bias level.

It is a further object of the present invention to provide a circuit for automatically setting and maintaining two opposing current sources equal in current.

Other objects and advantages of the present invention will be apparent to those skilled in the art from a reading of the following brief description of the drawings, the detailed description of the invention, and the appended claims.

DETAILED DESCRIPTION OF THE INVENTION

Figure 1:
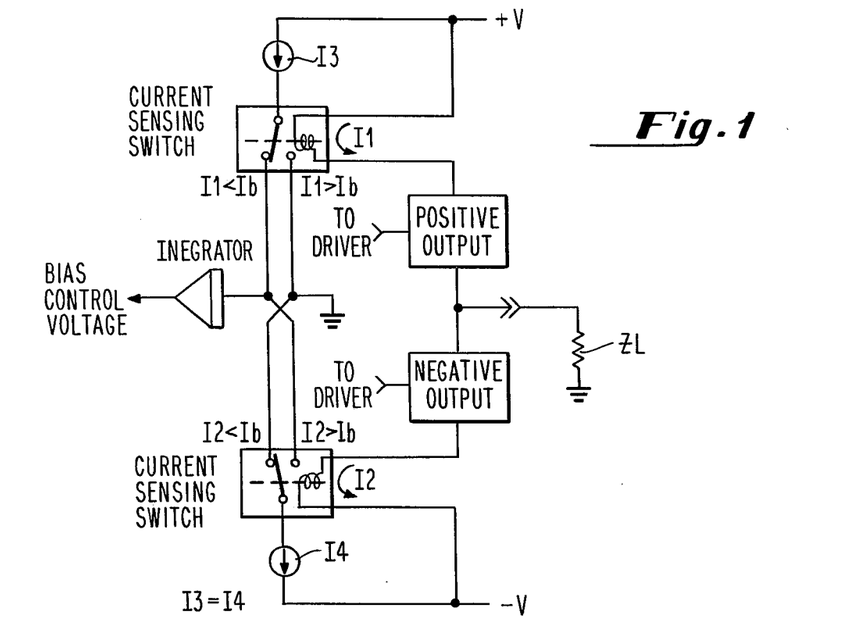
FIG. 1 is a schematic diagram, partially in block form, illustrating the basic principles of operation of the automatic bias adjusting circuit.

The operation of the invention can be understood with reference to the diagram given in FIG. 1. In this figure, as in most of the other figures, the actual circuitry for the push-pull amplifier is not given. The blocks labeled "Positive Output" and "Negative Output" are assumed to represent the positive and negative outputs from a conventional push-pull amplifier circuit. The amplifier load is represented by ZL. The actual amplifier circuitry is well known in the art and need not be explicitly given for purposes of describing the present invention. Also, for purposes of clarity, components having essentially identical functions are labeled with the same symbols in all of the drawings.

Before describing the operation of the circuit given in FIG. 1, it should be mentioned that the current sensing switches, depicted as electromechanical relays in FIG. 1 would not actually be electromechanical devices in a practical realization. The circuit of FIG. 1 is shown only for ease of understanding of the basic principles of the invention.

Suppose that the push-pull amplifier is momentarily at a zero crossing, i.e, there is no positive output and no negative output at this particular instant. As was stated earlier, the only current that will be flowing through the output stage will be the bias current. Therefore, when I1 (the current being consumed by the positive side of the output stage) and I2 (the current being consumed by the negative side of the output stage) are both greater than the desired bias current (which will be denoted as Ib), the bias level is too high. The positive and negative current sensing switches will both be activated, so that current I3 will be shunted to ground and I4 will be connected to the input of the integrator. Because the direction of I4 is negative, and since the integrator inverts as well as integrates, the output of the integrator will be ramped positive. This integrator output is used as a bias control voltage, and is harnessed in a way that will result in a decrease in bias current with an increase in voltage. Specific currents for accomplishing this task will be described below.

If, at the instant of a zero crossing, both I1 and I2 are less than the desired bias current level (Ib), neither current sensing switch will be activated, and it will be I3 that is connected to the input of the integrator, while I4 is shunted to ground. In this case, positive current I3 will be integrated and inverted, so that there will be a negative going bias control voltage developed which will be harnessed to increase the bias level.

During most of the operating cycle, of course, there will be signal current appearing in either the positive or the negative output stage of the amplifier. But because of the nature of the push-pull circuit, signal current will flow in one stage but not both. Suppose, for example, that signal current is flowing through the positive output stage. In this case, the positive output side will be drawing a current greater than Ib, but the negative output side will be drawing less current than Ib. Thus, the current sensing switch associated with the positive output side will be activated, and current I3 will be shunted to ground. At the same time, the current sensing switch associated with the negative output side will not be activated, and current I4 will also be shunted to ground. The net result is that there is no input to the integrator, and the integrator will therefore hold its output at the same level attained during the last zero crossing. Similarly, if signal current is flowing in the negative output stage, the negative output current will be greater than Ib, while the current flowing in the positive output side will be less than Ib. Therefore, the current sensing switch in the negative output side will be activated, and the current sensing switch on the positive side will not be activated. In this case, both currents I4 and I3 will be connected to the integrator. But because currents I4 and I3 are of opposite sign (and are made equal in magnitude by the external circuit), there is again no net current into the integrator. Therefore, the integrator again maintains its same output level, determined by what happened at the last zero crossing. In short, whenever there is either positive or negative signal output current flowing, the bias level is fixed; the bias is corrected only when the output current approaches its zero crossing.

It is apparent that if an amplifier were to operate without output current zero crossings, the circuit shown in FIG. 1 would not be able to regulate bias current. This condition would occur if the amplifier were reproducing direct current. Also, if the amplifier output passes through the zero crossing so quickly as to make measurement impossible, the circuit of FIG. 1 would again fail to operate properly. But when the amplifier is used in audio applications, neither of these anomalies will occur. By making the two currents I3 and I4 very close in level, and by using an integrator with a small amount of drift, it is possible to hold a bias control voltage sufficiently long to outlast even subsonic signals that approach direct current. And, since the bandwidth of audio source material is far from infinite, the output current does not pass through the zero fast enough to escape measurement, assuming reasonable care is exercised in designing the current sensing switches to operate quickly.

Figure 2:
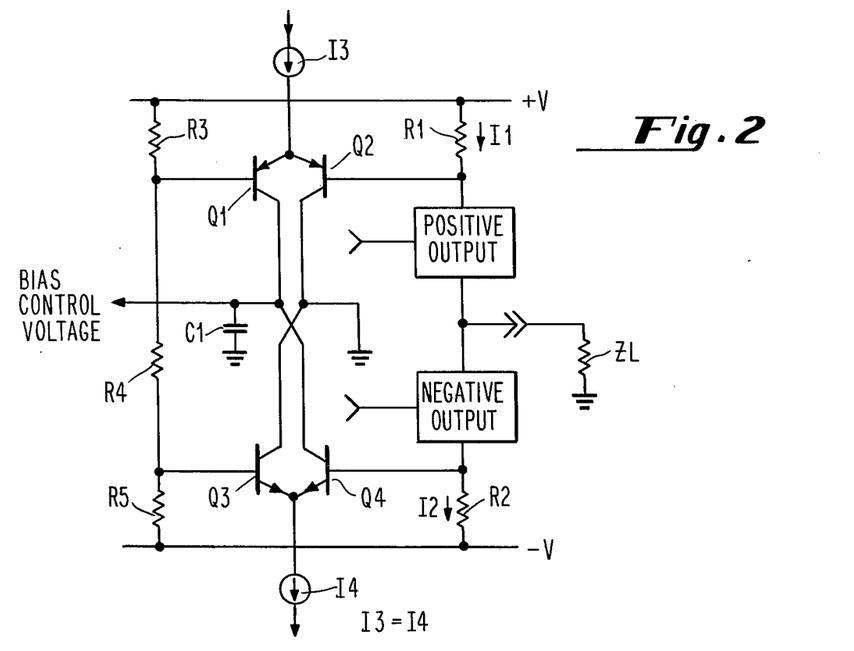
FIG. 2 is a schematic diagram illustrating a practical realization of the basic circuit shown in FIG. 1.

It was stated that the electromechanical relays shown in FIG. 1 were described only for ease of explanation. FIG. 2 shows a practical circuit for accomplishing the functions of the basic circuit of FIG. 1. In FIG. 2, the switching is done electronically, that is, by two pairs of transistors. A voltage is developed across resistors R1 and R2, which is used to gauge the amount of current flowing in each half of the output stage. Resistors R3, R4, and R5 are selected such that the voltages at their nodes will be equal to that developed across current sensing resistors R1 and R2 when the bias current is exactly equal to Ib, the desired bias current level. The transistor pairs are connected as differential amplifiers. Thus, whenever the positive output stage is drawing less current than Ib, Q1 will conduct, and Q2 will be cut off. When the current in the positive output stage exceeds Ib, Q2 will conduct, and Q1 will be cut off. A similar analysis applies for transistors Q3 and Q4. Therefore, when the push-pull amplifier is momentarily at a zero crossing (i.e. no signal current flowing in either the positive or negative output stages), either Q2 and Q4 will conduct (with Q1 and Q3 cut off), or Q1 and Q3 will conduct (while Q2 and Q4 are cut off). Thus, the input to integrating capacitor C1 will be either positive or negative, just as was described with reference to FIG. 1.

In FIG. 2, if there is positive signal current, then it will be Q2 and Q3 which conduct, with Q1 and Q4 cut off, resulting in no input to integrating capacitor C1. If the signal current is negative, Q1 and Q4 will conduct, with Q2 and Q3 cut off, so that there are equal and opposite inputs to the integrating capacitor C1. Thus, in the case of positive or negative signal output, there will be no bias correction performed.

For the current shown in FIG. 2 to operate properly, Q2 and Q4 must be completely cut off when the corresponding sensing resistor (R1 or R2) sees zero current. The required voltage difference across a given differential amplifier to achieve complete turnoff will depend on the amount of emitter current used, and the higher the current, the lower the required difference. However, increasing this current will require a corresponding increase in the size of the integrating capacitor. A compromise value will, therefore, have to be reached on this emitter current, and the voltages across R3 and R5 will need to be sufficiently large (typically greater than 200 mV) to shut one side of the differential amplifiers off when the voltage across the current sensing resistor is zero. Assuming that the minimum acceptable voltage across R3 is 200 mV, and since the voltage across R1 must equal this voltage at the desired bias level, the value for R1 (in ohms) must be given by 0.2/Ib, where Ib is the desired bias current level (in amperes).

Figure 3:
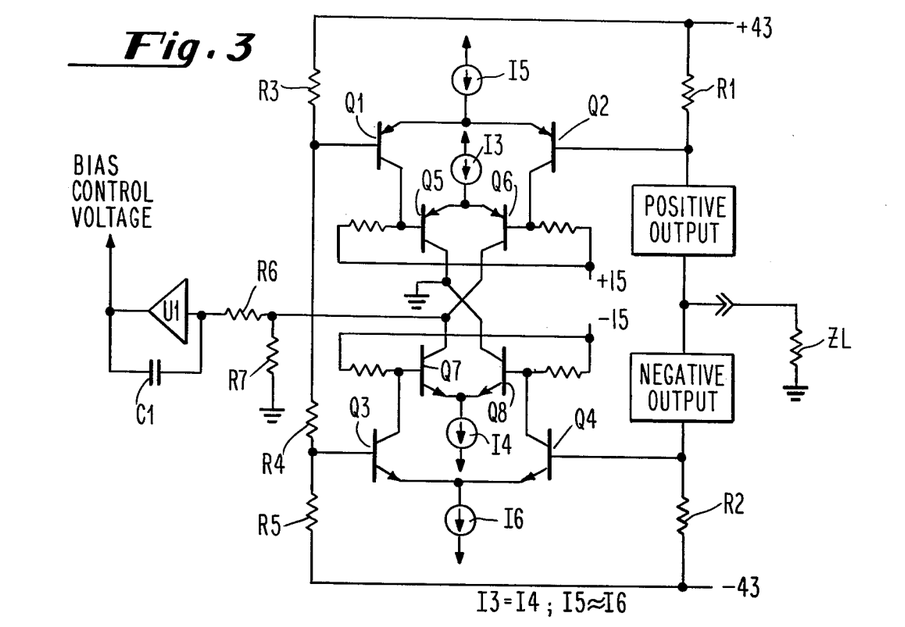
FIG. 3 is a schematic diagram showing another embodiment of the present invention for the purposes of decreasing amplifier power losses and reducing the size of the required integrating capacitor.

It is desirable that R1 be as small as possible to conserve power, but the circuit in FIG. 2 places a minimum value upon the current sensing resistors R1 and R2 that in some designs is unacceptable. If the differential amplifiers where to have additional gain, less voltage would be needed to shut them fully off. The improved circuit shown in FIG. 3 provides this additional gain by cascading a second pair of differential amplifiers in series with the first pair. These pairs are shown as transistors Q5 and Q6, and Q7 and Q8. This circuit can be made so sensitive that the minimum value for R1 and R2 is now dictated only by offset errors in the first pairs of differential amplifiers. In the embodiment of FIG. 3, the integrating capacitor has been replaced by an active integrator. With a virtual ground input, this allows a current attenuator to be formed with the addition of resistors R6 and R7, and permits the capacitance of C1 to be reduced.

It was already observed that the integrator circuit must have low drift characteristics in order to operate at its best when long periods exist between zero crossings of the amplifier signal. Such is the case when the amplifier must reproduce subsonic signals that could be present, for example, when playing warped phonograph records. Experience has shown that a simple FET input operational amplifier, in the form of an integrated circuit, and a ceramic integrating capacitor is satisfactory for avoiding this problem. However, when higher performance is desired, there are several measures that can be taken that will reduce integrator drift even further. C1 would be replaced with a low leakage polypropylene, polystyrene or polycarbonate type. U1, the integrated circuit which performs the signal integration, should remain a low-input-current FET type but, in addition, the input offset error should be kept low to prevent leakage current from flowing through R6 and R7. The leakage of transistors Q6 and Q7 should be very small in comparison to the magnitude of currents I3 and I4. Finally, great care must be exercised in matching currents I3 and I4 so that no significant difference exists. One method would be to include a trimmer in the current source and sink circuit so that any differences could be manually eliminated.

Figure 4:
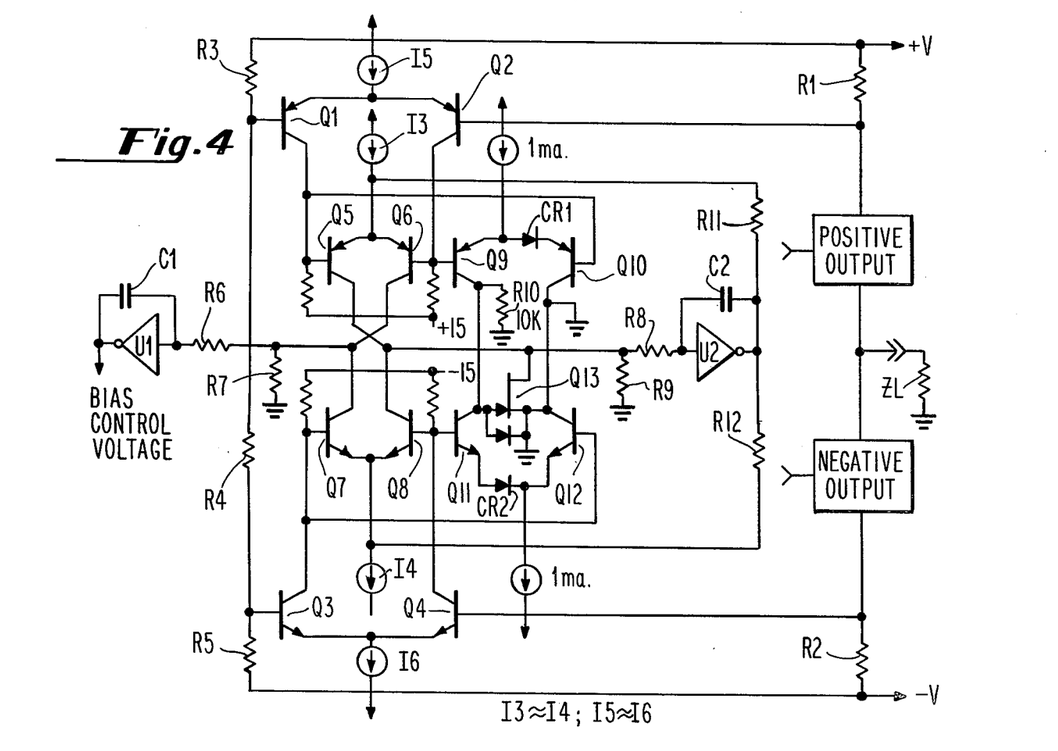
FIG. 4 is a schematic diagram illustrating still another embodiment of the present invention showing a practical method of automatically matching the magnitudes of two opposing current sources.
Figure 5:
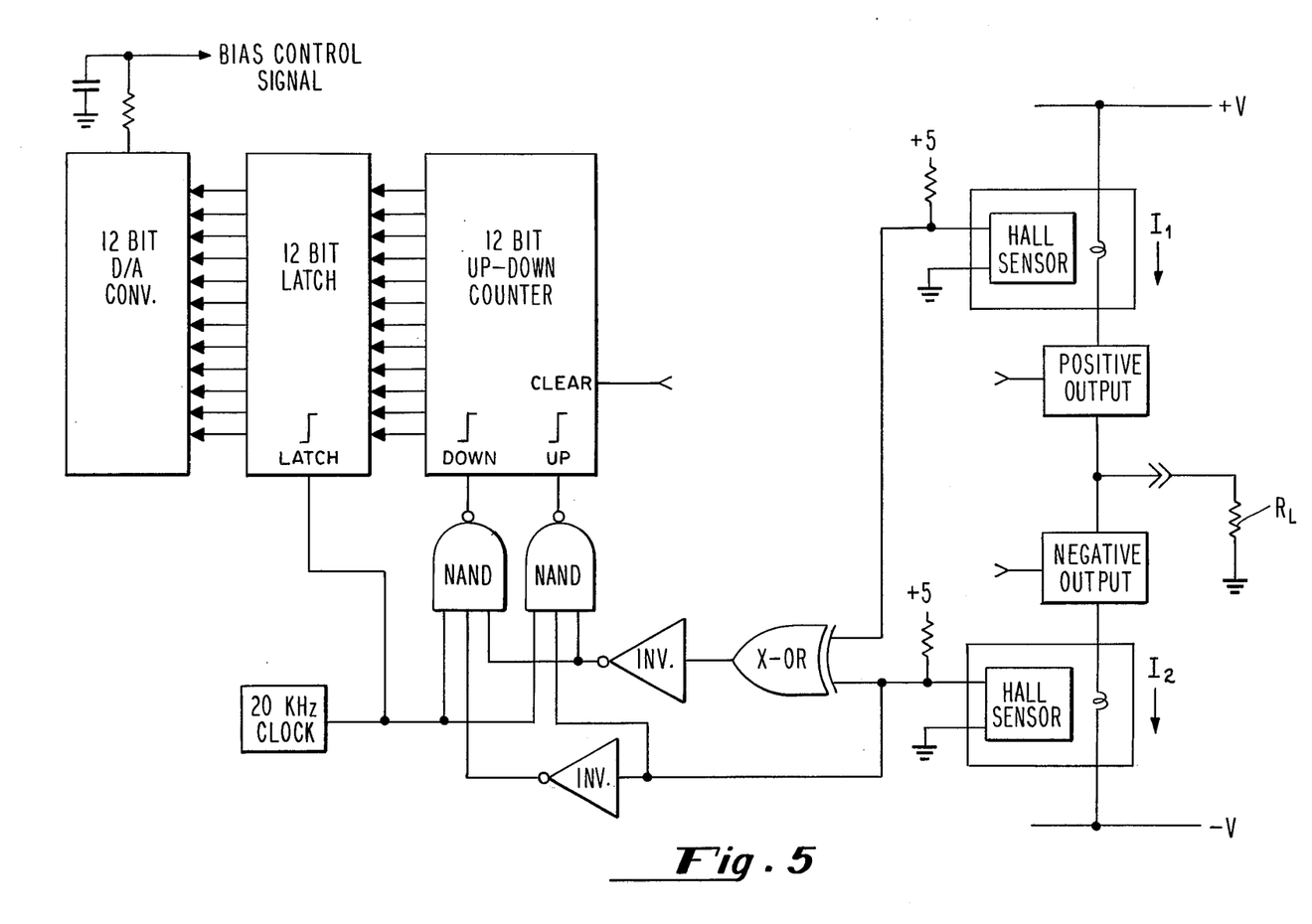
FIG. 5 is a schematic diagram showing another embodiment of the present invention in which digital circuits are employed to achieve the same results.

A more elegant solution to the problem of matching currents I3 and I4 is shown in the circuit of FIG. 4. This circuit measures the difference between the two currents and automatically corrects for any offset. Q13 is a low-resistance FET switch which shunts any current from the collector of Q5 or Q8 to ground except when both Q5 and Q8 are fully on. When they are on, however, Q13 shuts off and allows the integrator U2 to see any offset current that may be present between I3 and I4. The output of U2 is then fed back to trim I3 and I4 equal to each other. Diodes CR1 and CR2 allow transistors Q10 and Q11 to turn on only after Q5 and Q8 are fully conducting. Only when Q11 is on and Q9 is off will the voltage at the gate of Q13 go negative, shutting the FET Q13 off.

In FIG. 5, another method using the same principle but a different technique for achieving bias regulation is shown. The output current sensing devices are a pair of Hall effect current sensors. The logical outputs of these Hall sensors are fed into an array of gates that control the operation of the up-down counter. These gates perform the same logical function as the current sources "I3" and "I4" and the collector hookups of transistors "Q1-Q4" in FIG. 2. The up-down counter, latch, and digital to analog (D/A) converter all work together to form a digital integrator.

Whenever currents "I1" or "I2" exceed "Ib", the respective Hall sensor output goes low. It was already shown that when both currents are high, it is desirable to reduce bias current. Under these conditions, both Hall outputs will be low. The exclusive OR output will also be low. This low signal will be inverted and fed to the NAND gates. In this case, the gate connected to the counter's down input will turn on and the counter will count down at a rate equal to the clock frequency. If both Hall sensor outputs were high, such as would be the case if "I1" and "I2" were both less than "Ib", the counter would count up because the "up" input NAND gate would be enabled.

Whenever only one of the currents "I1" and "I2" are greater than "Ib", it was already shown that the bias level should remain constant. In this situation, one Hall sensor output will be low, the other high. This, in turn, will cause the output of the exclusive or gate to go high. Since this signal is inverted low before going to the NAND gates, these gates are forced high, thereby shutting off the clock. Under these conditions, the up-down counter will hold its present count and keep the bias level constant.

Only on the negative edge of the clock pulses can the up-down counter be stepped. This is because the counter is a positive edge triggered device and the clock signal is inverted before reaching it. On the positive edge of the clock pulse, the latches are enabled transferring the count to the D/A converter. The purpose of the latch is to prevent the D/A from seeing glitches during the unsettled time before all the counter's carry and borrow signals are processed. The R/C network on the output of the D/A is to prevent very short glitches from appearing on the bias control output during data transitions. It should be noted that the bias control signal in this example is inverted from that in previous examples. That is, when the bias control voltage increases, the bias level should be made to increase.

Upon power turn-on, a logical low signal is fed to the up-down counter's clear input causing the bias control to be set to its lowest possible level. One other characteristic of this design that should be noticed is that one-half the time there is a positive transition at the output of the exclusive or gate, there will be one false count generated. This is not a very serious problem but it could be reduced by decreasing the duty cycle of the clock to say, 10% high and 90% low. This would reduce the chance of a false count to 1 out of 10. If this characteristic had to be eliminated entirely, a somewhat more complex gate arrangement would be needed.

In all of the cases described so far, it has not been shown how the bias control voltage developed at the output of the integrator is used to control the bias level. FIG. 6 shows an embodiment of the invention which shows explicitly the bias control circuit. Note also that in FIG. 6, the actual push-pull amplifier (transistor Q101-Q104) is shown explicitly. As stated earlier, similar component labels (such as R1, R2 etc.) refer to corresponding components in the previous figures. In FIG. 6, the bias control voltage developed across integrating capacitor C1 is fed to the gate of a MOSFET Q5 which has a negligible effect on the operation of the integrator. When bias is low, the voltage on the gate increases, and since Q5 is an enhancement type MOSFET, the drain current will increase. The light emitting diode CR3 will, therefore, glow brighter. Diode CR3 is optically coupled to phototransistor Q14, and therefore Q14 will conduct. Base drive to transistor Q15 will thus be reduced, increasing the voltage across Q15 and finally the bias current through Q103 and Q104 is increased. When bias is high, CR3 will emit less light, and the bias current will be reduced.

One additional factor to consider in the circuit of FIG. 6 is that when power is first turned on to the circuit, the bias must not be at a level which could result in damage to the output devices. In FIG. 6, when power is turned on, capacitor C1 is discharged, which means that transistor Q14 is off, and Q15 is saturated, so that there will be no bias current through the output stage. The purpose of diode CR4 is to insure that capacitor C1 will be quickly discharged when power is turned off.

In FIG. 6, the level of bias is controlled with a shunt type regulator made up of transistors Q14 and Q15. In this circuit, the predriver (not shown) is normally operated push-pull class A. That is, the peak current capability from either side is double the quiescent current. Although it is desirable to keep the quiescent current as low as possible to conserve power, doing so will reduce the amplifier's slew rate and bandwidth. FIG. 7 illustrates a different method of controlling bias which solves the above problem of quiescent current. Note that FIG. 7 also shows the push-pull amplifier circuit explicitly (see Q103-Q106). Instead of a shunt type regulator, a resistor R11 is used. The bias is regulated at a point before the drivers Q105 and Q106. In this circuit, the quiescent current through these drivers is typically 250 ma, but the peak drive current can be as high as the IDSS of the device, or in this case, 3000 ma.

The advantages afforded by the circuit shown in FIG. 7 would not be realized without an efficient method of biasing the output devices. In a case such as this, traditional non-feedback type biasing schemes do not offer even a workable solution to the temperature stability problems encountered. A system of bias regulation with feedback, however, can compensate for changing circuit conditions and, therefore allows new output configurations such as that shown in FIG. 7.

The biasing circuit shown in FIG. 7 is similar to the previous circuits described, but uses the voltage at the output of the integrating capacitor C1 to control the current through a depletion type FET Q20. When the bias current is too high, the integrator voltage ramps up, increasing the current through transistor Q20. This same current travels through common base stages Q21 and Q22 and is reflected by current mirror pairs consisting of Q23 and Q24, and Q25 and Q26. With transistors Q24 and Q26 now conducting more heavily, the current through Q105 and Q106 is reduced. This results in a decrease in voltage across resistor R11, which finally reduces the bias current through outputs Q103 and Q104.

The circuits described above exhibit excellent performance in maintaining precise control of output bias currents. In addition, the automatic bias adjusting circuit offers another advantage in protecting an amplifier against destruction in the event that dangerous high frequency signals are applied to the amplifier's input. Under such conditions, particularly with bipolar designs, one side of the output will turn on before the other side has had a chance to turn off. This results in a large amount of current flowing through the two sides of the output stages which, in a very short time, can destroy the output devices. The automatic bias adjusting circuit, however, sees this increased current as an increase in bias, and automatically cuts back on the current demands of the output stage, thereby protecting the amplifier.

The necessity of the circuit such as that described in this disclosure, will become even more apparent as MOSFET amplifiers replace older bipolar designs. MOSFETs, while being superior to bipolar transistors in speed and safe operating area characteristics, are difficult to bias efficiently, even more so than bipolar transistors. This circuit enables devices which are hard to bias, such as MOSFETs and FETs, to be used efficiently in push-pull amplifiers while, at the same time, removing many of the output configuration restrictions that, using conventional techniques, were necessary to achieve adequate bias stability. The result will be an overall improvement in amplifier performance, since compromises made in the interest of maintaining proper bias levels no longer must be made.

It is seen that the objects of the present invention have been fully met by the above disclosure. As stated above, many further modifications can be made to the automatic bias adjusting circuit, within this scope of the present invention. The particular circuit design of the push-pull amplifier used is not critical. It is understood that this invention is not to be deemed limited to one particular circuit configuration.

What is claimed is:

1. A circuit for automatic bias adjustment of a push-pull amplifier comprising:
   a. current measuring means for comparing the current consumed by each half of said push-pull amplifier with a predetermined current level;
   b. logic means for generating a control signal depending upon the input to said current measuring means;
   c. means for integrating the control signals of said logic means, and
   d. bias control means connected to the output of said integrating means.

2. The circuit of claim 1, wherein said integrating means comprises a capacitor.

3. The circuit of claim 1, wherein said integrating means comprises an operational amplifier with an integrating capacitor connected between its output and inverting input.

4. The circuit of claim 1, wherein said integrating means comprises a digital up-down counter and a digital to analog converter.

5. The circuit of claim 1, wherein said logic means comprises two equal and opposite current sources whose current paths are determined by a pair of relay equivalents.

6. The circuit of claim 5, wherein said relay equivalents comprise electronic differential amplifiers.

7. The circuit of claim 6, wherein said differential amplifiers comprise a pair of transistors.

8. The circuit of claim 7, further comprising an additional amplification stage connected in cascade with at least one of said differential amplifiers.

9. The circuit of claim 5, further comprising feedback means for equalizing the currents in said opposing current sources.

10. The circuit of claim 1, wherein said logic means comprises an electronic gating circuit, said gating circuit being connected between said current measuring and said integrating means.

11. The circuit of claim 1, wherein said current measuring means comprises a Hall sensor adapted for measuring the flow of output current through said push-pull amplifier.

12. The circuit of claim 1, wherein said current measuring means comprises at least one resistor connected between the power supply input of both sides of the output stage and the power supply.

13. The circuit of claim 1, wherein said bias control means comprises a light-emitting diode connected to said integrating means, a phototransistor positioned for actuation by said light-emitting diode, and means for connecting the output of said phototransistor to said push-pull amplifier in a way that will control bias levels.

14. The circuit of claim 1, wherein said bias control means comprises a voltage-to-current converting circuit to change the bias control voltage into a current which is amplified to control the output bias level.

15. A circuit for automatic bias adjustment of a push-pull amplifier comprising:
   a. first and second differential amplifiers, wherein the inputs of said first differential amplifier are connected to a voltage reference and a current sensing resistor, wherein the inputs of said second differential amplifier are connected to a negative voltage reference and a current sensing resistor;
   b. logic means comprising two equal and opposite current sources whose current flow is directed by said differential amplifiers;
   c. integrating means connected to the output of said logic means; and
   d. bias control means for connecting the output of said integrating means to said push-pull amplifier in a way that will control the amount of output bias current.

16. The circuit of claim 15, wherein said integrating means comprises a capacitor.

17. The circuit of claim 15, wherein said integrating means comprises an operational amplifier with a capacitor connected between its output and inverting input.

18. The circuit of claim 15, further comprising feedback means for equalizing said two opposing current sources.

19. The circuit of claim 15, wherein said bias control means consists of a light-emitting diode optically coupled to a phototransistor which controls output bias current levels.

20. The circuit of claim 15, wherein said bias control means comprises means for converting the bias control voltage into one or more bias control currents, and means for using this current to control the operating point of driver transistors which directly control bias current levels of the output devices.

21. A circuit for automatic bias adjustment of a push-pull amplifier comprising:
   a. a pair of Hall sensors for measuring the current consumption of both halves of the push-pull output stage;
   b. an electronic gating circuit, wherein the outputs of said Hall sensors are the inputs to said gating circuit;
   c. a digital integrating means connected to the outputs of said gating circuit; and
   d. a bias control means connected to the output of said integrating means whereby the bias level of said amplifier is controlled by the output of said integrating means.

22. The circuit of claim 21, wherein said integrating means comprises an electronic counter and digital to analog converter.

23. The circuit of claim 22, further comprising an electronic latch between said digital counter and digital to analog converter.

* * * * *

UNITED STATES PATENT OFFICE
CERTIFICATE OF CORRECTION

Patent No. 4,237,425          Dated December 2, 1980

Inventor(s) David A. Spiegel

It is certified that error appears in the above-identified patent and that said Letters Patent are hereby corrected as shown below:

In column 1, line 61, the word "crossing" should be ---crossings---.

In column 2, lines 26-27, the sentence "By the same token, analog logic means with slight modification." should be deleted.

In column 4, line 48, the word "into" should be ---input to---.

In column 6, line 22, the word "would" should be ---could---.

In column 7, line 48, the word "transistor" should be ---transistors---.

Signed and Sealed this

Twenty-fourth Day of March 1981

[SEAL]

Attest:

RENE D. TEGTMEYER

Attesting Officer     Acting Commissioner of Patents and Trademark